(12) United States Patent
Seol et al.

(10) Patent No.: US 9,935,280 B2
(45) Date of Patent: Apr. 3, 2018

(54) FLEXIBLE SUBSTRATE AND METHOD OF MANUFACTURING THEREOF AND FLEXIBLE DISPLAY DEVICE HAVING THE FLEXIBLE SUBSTRATE

(71) Applicant: Samsung Display Co., Ltd., Yongin-si, Gyeonggi-do (KR)

(72) Inventors: Young Gug Seol, Yongin-si (KR); Tae Woong Kim, Yongin-si (KR); Ju Chan Park, Yongin-si (KR); Pil Suk Lee, Yongin-si (KR); Jin Hwan Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 3 days.

(21) Appl. No.: 15/015,035

(22) Filed: Feb. 3, 2016

(65) Prior Publication Data

US 2016/0315276 A1 Oct. 27, 2016

(30) Foreign Application Priority Data

Apr. 24, 2015 (KR) .......................... 10-2015-0058106

(51) Int. Cl.
*H01L 21/52* (2006.01)
*H01L 51/00* (2006.01)
(Continued)

(52) U.S. Cl.
CPC ............ *H01L 51/0097* (2013.01); *B32B 7/00* (2013.01); *B32B 7/12* (2013.01); *B32B 27/00* (2013.01); *B32B 27/06* (2013.01); *B32B 27/08* (2013.01); *H01L 27/1218* (2013.01); *H01L 27/3262* (2013.01); *H01L 51/5256* (2013.01); *B32B 37/10* (2013.01); *B32B 37/12* (2013.01); *B32B 37/1284* (2013.01); *B32B 37/14* (2013.01); *B32B 2037/1253* (2013.01); *B32B 2255/10* (2013.01); *B32B 2255/26* (2013.01); *B32B 2307/20* (2013.01); *B32B 2307/206* (2013.01);
(Continued)

(58) Field of Classification Search
CPC ............ H01L 51/5243; H01L 51/5246; H01L 51/5253
See application file for complete search history.

(56) References Cited

U.S. PATENT DOCUMENTS

2009/0173893 A1* 7/2009 Tanaka ............... B23K 26/0604
250/492.2
2013/0089954 A1* 4/2013 Ro ........................ H01L 51/003
438/113
(Continued)

FOREIGN PATENT DOCUMENTS

KR 10-2013-0068561 A 6/2013
KR 10-1293803 B1 7/2013
KR 10-2014-0078182 A 6/2014

*Primary Examiner* — Thomas L Dickey
(74) *Attorney, Agent, or Firm* — Knobbe, Martens, Olson & Bear, LLP

(57) ABSTRACT

In an aspect, a flexible substrate may include a base substrate, an insulating layer positioned on a first surface of the base substrate, a protective film positioned on a second surface facing the first surface of the base substrate and an adhesive layer positioned between the base substrate and the protective film and attaching the protective film on the second surface of the base substrate. The adhesive layer may include a cross-linker.

16 Claims, 6 Drawing Sheets

(51) Int. Cl.

| | | |
|---|---|---|
| *H01L 27/32* | (2006.01) | |
| *H01L 51/52* | (2006.01) | |
| *H01L 27/12* | (2006.01) | |
| *B32B 7/12* | (2006.01) | |
| *B32B 27/08* | (2006.01) | |
| *B32B 7/00* | (2006.01) | |
| *B32B 27/00* | (2006.01) | |
| *B32B 27/06* | (2006.01) | |
| *B32B 37/12* | (2006.01) | |
| *B32B 37/14* | (2006.01) | |
| *B32B 37/10* | (2006.01) | |
| *H01L 51/05* | (2006.01) | |

(52) U.S. Cl.
CPC . *B32B 2307/546* (2013.01); *B32B 2307/7244* (2013.01); *B32B 2307/7246* (2013.01); *B32B 2310/0831* (2013.01); *B32B 2457/20* (2013.01); *H01L 51/0512* (2013.01); *H01L 2251/5338* (2013.01); *Y02E 10/549* (2013.01); *Y02P 70/521* (2015.11)

(56) References Cited

U.S. PATENT DOCUMENTS

| | | | |
|---|---|---|---|
| 2013/0300284 A1* | 11/2013 | Nishido | H01L 51/0097 313/511 |
| 2014/0264302 A1 | 9/2014 | Yoo et al. | |
| 2014/0291630 A1 | 10/2014 | Namkung | |
| 2015/0060784 A1 | 3/2015 | Lee et al. | |
| 2015/0079507 A1* | 3/2015 | Kandanarachchi | C09D 135/06 430/18 |

\* cited by examiner

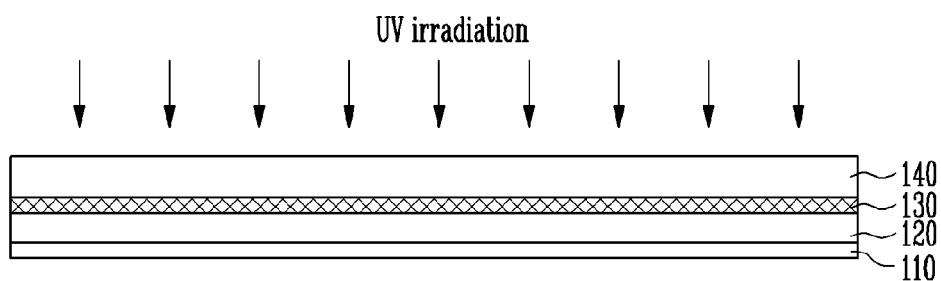
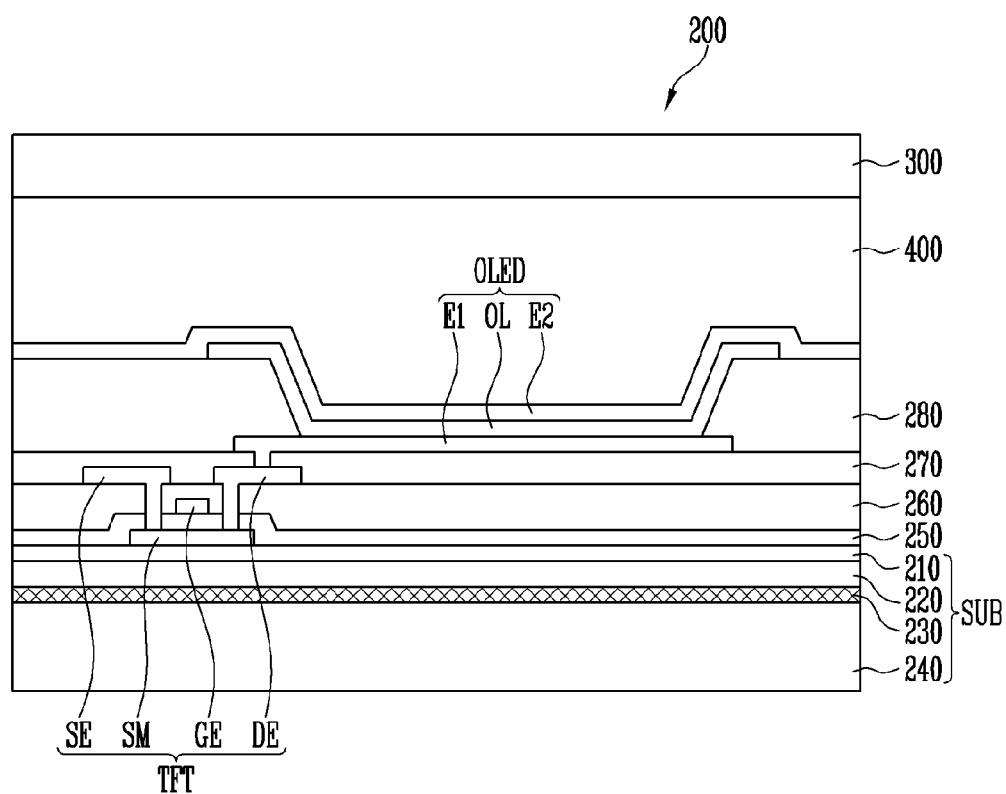

FLEXIBLE SUBSTRATE AND METHOD OF MANUFACTURING THEREOF AND FLEXIBLE DISPLAY DEVICE HAVING THE FLEXIBLE SUBSTRATE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to and the benefit of Korean Patent Application No. 10-2015-0058106, filed on Apr. 24, 2015, in the Korean Intellectual Property Office, the entire content of which is incorporated herein by reference in its entirety.

BACKGROUND

Field

The described technology generally relates to a flexible substrate and a method of manufacturing thereof and a flexible display apparatus having the flexible substrate.

Description of the Related Technology

In recent years, desktop displays have been replaced with thin film displays on mobile devices. In particular, applications and uses of a flexible display device capable of bending or folding according to user needs are increasing, therefore the need for providing a step of bending or folding in a manufacturing process is ever increasing and in high demand among display devices.

Such flexible display device may be manufactured by performing a backplane process after coating a polyimide (PI) substrate on a carrier glass. Also, the flexible display device may be manufactured by applying a lower protective film in order to protect the backplane by going through laser desorption process after the backplane process.

Meanwhile, in the case of a flexible display, change in shape continuously occurs in which the display device bends or folds. Therefore, in order to reduce stress on the polyimide (PI) substrate, by using a pressure sensitive adhesive PSA, a lower protective film may be attached to the lower portion of the polyimide PI substrate.

SUMMARY

An embodiment of the present disclosure relates to a flexible substrate having enhanced reliability of a product.

In an embodiment, a flexible substrate may include a base substrate, an insulating layer positioned on a first surface of the base substrate, a protective film positioned on a second surface facing the first surface of the base substrate and an adhesive layer positioned between the base substrate and the protective film and attaching the protective film on the second surface of the base substrate. The adhesive layer may include a cross-linker.

The adhesive layer may include at least any one of acrylic resin or epoxy resin.

The cross-linker may include at least any one of an optical initiator or a heat initiator.

The base substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP).

The insulating layer may include polyimide (PI) or polyphenylene.

Weight loss of the polyimide (PI) or the polyphenylene may be 0.3% or less at 450° C.

In an embodiment, a method for manufacturing may include forming an insulating layer on a first surface of a base substrate, forming an adhesive layer on a second surface facing the first surface of the base substrate, providing a protective film on the adhesive layer, attaching the protective film and the base substrate by pressurizing the protective film and hardening the adhesive layer. The adhesive layer may include a cross-linker.

The hardening of the adhesive layer may include any one selected from a method of irradiating ultraviolet (UV) light, a method of irradiating laser, or a method of heat processing.

The coating of the adhesive layer on the second surface facing the first surface of the base substrate may be achieved by a slit coating method.

In an embodiment, a flexible display device may include a flexible substrate and an emission device disposed on the flexible substrate. The flexible substrate may include a base substrate, an insulating layer positioned on a first surface of the base substrate, a thin film transistor formed on the insulating layer, a protective film positioned on a second surface facing the first surface of the base substrate and an adhesive layer positioned between the base substrate and the protective film and attaching the protective film on the second surface of the base substrate. The adhesive layer may include a cross-linker.

The adhesive layer may include at least one of acrylic resin or epoxy resin.

The cross-linker may include at least one of an optical initiator or a heat initiator.

The base substrate may include one of polyethersulfone (PES), polyacrylate, polyetherimide (PEI), polyethyelene naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP).

The insulating layer may include polyimide (PI) or polyphenylene.

The polyimide (PI) or the polyphenylene may have 0.3% or less weight-loss at 450° C.

The thin film transistor may include a semiconductor layer, a gate insulating film disposed on the semiconductor layer, a gate electrode disposed on the gate insulating film, an interlayer insulating film disposed on the gate electrode and a source electrode and a drain electrode disposed on the interlayer insulating film. The interlayer insulating film may be formed of an organic insulating material.

The interlayer insulating film may include polyimide (PI) or polyphenylene.

The polyimide (PI) or the polyphenylene may have 0.5% or less weight loss at 350° C.

In an embodiment, a flexible substrate and a method for manufacturing the same, and a flexible display device including the flexible substrate may more firmly attach a protective film and a base substrate by including an adhesive layer between the protective film and the base substrate, the adhesive layer including a cross-linker.

The problem wherein the protective film and the base substrate are separated from each other due to the stress caused as a result of the flexible device folds is minimized.

The insulating layer and the interlayer insulating film may further secure flexibility for the flexible display device by using organic insulating material.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2 to 4 are cross sectional views illustrating in a sequence a manufacturing method of a flexible substrate shown in FIG. 1.

FIG. 5 is a cross sectional view illustrating an example of a flexible display device according to an embodiment.

DETAILED DESCRIPTION

Figure 1:
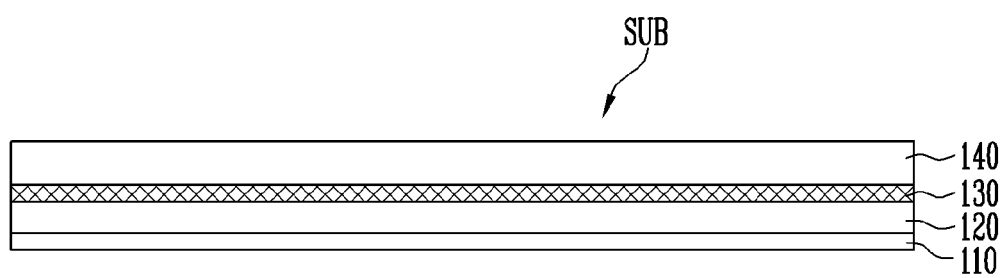
FIG. 1 is a cross sectional view schematically illustrating a flexible substrate according to an embodiment.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view schematically illustrating a flexible substrate according to an embodiment.

Referring to FIG. 1, a flexible substrate SUB may include a base substrate 120, an insulating layer 110 positioned on a first surface of the base substrate 120, an adhesive layer 130 positioned on a second surface facing the first surface of the base substrate 120 and a protective film 140 positioned on the adhesive layer 130.

The base substrate 120 may be any one of a film base substrate or a plastic base substrate including a high molecular weight organic material having flexible property. For example, but without limitation thereto, the base substrate 120 may include any one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP).

The insulating layer 110 may be positioned on a first surface of the base substrate 120. The insulating layer 110 may protect structures (not shown) to be formed in a subsequent process from penetration of impurities leaking from the base substrate 120. The insulating layer 110 may flatten a surface of the base substrate 120.

The insulating layer 110 may include an organic insulating material. The organic insulting material may undergo 0.3% or less weight loss at 450° C. The organic insulating material, weight loss of 0.3% or less may include polyimide (PI), polyphenylene, and the like. As the insulating layer 110 is made of organic insulating material, flexibility of the flexible substrate SUB may be achieved.

The protective film 140 may be attached to a second surface facing a first surface of the base substrate 120 by the adhesive layer 130. The protective film 140 may be made in a film form in which an inorganic matter is coated to an organic matter. The inorganic matter may include silicon oxide (SiOx), silicon nitride (SiNx), silicon oxynitride (SiON), aluminum oxide (AlO), aluminum oxynitride (AlON) and the like. The inorganic matter may be of a single layer structure or a multi-layer structure. The organic matter may include acrylic resin, polyimide (PI), polyester, and the like.

In particular, the protective film 140 may have a barrier property blocking oxygen and moisture from flowing into the base substrate 120 from outside and may have a thickness of 10 µm~50 µm. The protective film 140 may be made in film form in which inorganic matter is coated to organic matter, and flexibility of the flexible substrate SUB may be further secured.

The adhesive layer 130 may attach the protective film 140 to the second surface of the base substrate 120. The adhesive layer 130 may include resin and a cross-linker causing a hardening reaction by heat or light.

The resin may include acrylic resin, epoxy resin, and the like. The cross-linker may include an optical initiator causing a hardening reaction by light and a heat initiator causing a hardening reaction by heat.

The optical initiator may initiate a hardening reaction of a composition of the adhesive layer 130 by reacting to light irradiation such as ultraviolet (UV) light during a manufacturing process for the adhesive layer 130.

The type of the optical initiator is not specifically limited but may include alpha-hydroxy ketone compound (e.g., IRGACURE 184, IRGACURE500, IRGACURE 2959, DAROCUR 1173, Ciba Specialty Chemicals), phenyl glyoxylate compound (e.g., IRGACURE 754, DAROCUR MBF, Ciba Specialty Chemicals), benzyldimethyl-ketal compound (e.g., IRGACURE 651, Ciba Specialty Chemicals), alpha-amino ketone compound (e.g., IRGACURE 369, IRGACURE 907, IRGACURE 1300, Ciba Specialty Chemicals), mono acyl phosphine compound (MAPO) (e.g., DAROCUR TPO, Ciba Specialty Chemicals), bisacyl phosphine compound (BAPO) (e.g., IRGACURE 819, IRGACURE 819DW, Ciba Specialty Chemicals), phosphine oxide compound (e.g., IRGACURE 2100, Ciba Specialty Chemicals), metallocene compound (e.g., IRGACURE 784, Ciba Specialty Chemicals), iodonium salt (e.g., IRGACURE 250, Ciba Specialty Chemicals), or at least any one compound thereof (e.g., DAROCUR 4265, IRGACURE 2022, IRGACURE 1300, IRGACURE 2005, IRGACURE 2010, IRGACURE 2020, Ciba Specialty Chemicals). However, it is not limited thereto.

The heat initiator may initiate a hardening reaction of the composition of the adhesive layer 130 as a result of heating in a manufacturing process of the adhesive layer 130.

The type of the heat initiator is not specifically limited but may include a mixture of one or two types of azo compounds such as 2,2'-azobis(2-methylbutyronitrile), 2,2'-azobis (isobutyronitrile), 2,2'-azobis(2,4-dimethylvaleronitrile), 4,4-azobis(4-cyanovaleric acid), 1,1'-azobis(cyclohexane carbonitrile) and 2,2'-azobis(4-methoxy-2,4-dimethyl valeronitrile); peroxide compounds such as tetramethylbutylperoxy neo-decanoate (e.g., Perocta ND, NOF), bis(4-butycyclohexyl)peroxydicarbonate (e.g., Peroyl TCP, NOF), di-(2-ethylhexyl)peroxy carbonate, butylperoxy neo-decanoate (e.g., Perbutyl ND, NOF), di-n-propyl peroxydicarbonate (e.g., Peroyl NPP, NOF), di-isopropyl peroxy dicarbonate (e.g., Peroyl IPP, NOF), diethoxyethyl peroxydicarbonate (e.g., Peroyl EEP, NOF), diethoxylhexyl peroxydicarbonate (e.g., Peroyl OEP, NOF), hexyl peroxydicarbonate (e.g., Perhexyl ND, NOF), dimethoxybutyl peroxydicarbonate (e.g., Peroyl MBP, NOF), bis(3-metoxy-3-metoxybutyl) peroxydicarbonate (e.g., Peroyl SOP, NOF), dibutyl peroxy dicarbonate, diacetyl peroxydicarbonate, dimyristyl peroxydicarbonate, 1,1,3,3-tetramethylbutyl peroxypivalate, hexyl peroxypivalate (e.g., Perhexyl PV, NOF), butyl peroxypivalate (e.g., Perbutyl, NOF), 3,5,5-trimethylhexanol peroxide (e.g., Peroyl 355, NOF), 1,1-dimethyl-3-hydroxybutyl peroxy-neodecanoate (e.g., Luperox 610M75, Altofina), t-amyl peroxy-neodecanoate (e.g., Luperox 546M75, Atofina), t-butyl peroxy-neodecanoate (e.g., Luperox 10M75, Atofina), t-butyl peroxy-neoheptanoate, t-butyl peroxy-pivalate, t-amyl peroxy-2-ethylhexanoate, lauroyl peroxide, dilauroyl peroxide, didecanoyl peroxide, benzoyl peroxide, dibenzoyl peroxide, 2,2-bis(tert-butylperoxy)butane, 1,1-bis(tert-butyl peroxy)cyclohexane, 2,5-bis(tert-butylperoxy)-1-methylethyl)benzene, 1,1-bis(tert-butylperoxy)-3,3,5-trimethylcyclohexane, tert-butyl hydroperoxide, tert-butyl peroxide, tert-butyl peroxybenzoate, tert-butylperoxy isopropyl carbonate, cumene hydroperoxide, dicumyl peroxide, lauroyl peroxide and 2,4-pentanedione peroxide; tert-butyl peracetate; peracetic acid; or potassium persulfate.

The adhesive layer 130 may be hardened through a hardening process since it includes a cross-linker. As the adhesive layer 130 is hardened between the protective film 140 and the second surface of the base substrate 120, the protective film 140 and the base substrate 120 may be more firmly attached to each other.

As described above, since the adhesive layer 130 is formed of a hardening resin composition that includes a cross-linker, by more firmly attaching the protective film 140 and the base substrate 120, the problem wherein the protective film 140 and the base substrate 120 are separated from each other may be minimized.

The insulating layer 110 may be formed of an organic insulating material, and the protective film 140 may be formed in a film form where inorganic matter is coated on organic matter, thereby further securing flexibility of the flexible substrate SUB.

Figure 2:
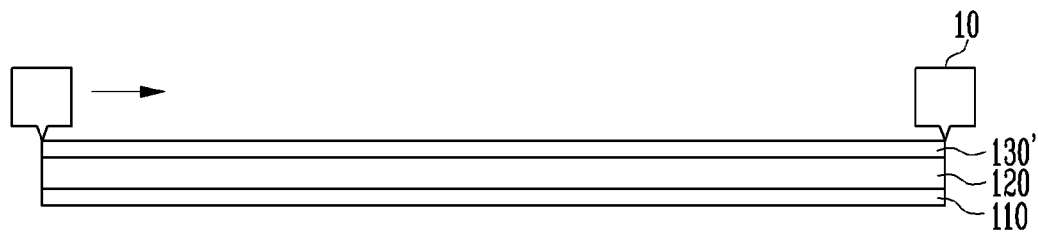
Figure 3:
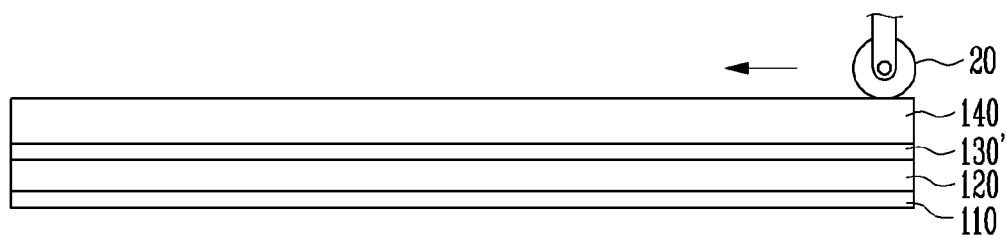

FIGS. 2 to 4 are cross sectional views illustrating the sequence of steps for manufacturing a flexible substrate shown in FIG. 1.

Referring to FIGS. 1 and 2, an insulating layer 110 may be disposed on a first surface of a base substrate 120. The insulating layer 110 may protect structures (not shown) to be formed in a subsequent process from penetration of impurities leaking from the base substrate 120. The insulating layer 110 may flatten a surface of the base substrate 120. The insulating layer 110 may include organic insulating matter.

A slit nozzle 10 may be positioned on an upper portion of a second surface which faces a first surface of the base substrate 120. The slit nozzle 10 may spray a coating liquid 130' having a regular thickness on a second surface of the base substrate 120. The coating liquid 130' may be formed of a curable resin composition which includes a cross-linker.

As for a method of spraying a coating liquid 130' on a second surface of the base substrate 120, a method of slit coating which can be applied to a large area may be used.

Referring to FIG. 3, a protective film 140 may be positioned on the coating liquid 130' coated on the second surface of the base substrate 120. By positioning a roller 20 on an upper portion of the protective film 140, a lamination process which pressurizes the protective film 140 may be performed. The protective film 140 may be fixed on the coating liquid 130' through the lamination process.

As shown in FIG. 4, by hardening a coating liquid (130' in FIG. 3) by irradiating UV light on the protective film 140, an adhesive layer 130 may be formed between the second surface of the base substrate 120 and the protective film 140. The adhesive layer 130 may be hardened and may more firmly attach the base substrate 120 and the protective film 140.

FIG. 5 is a cross sectional view illustrating an example of a flexible display device according to an embodiment. The flexible display device shown in FIG. 5 may be shown as an organic light emitting display device as an example but may include an electrophoresis display device, a liquid crystal display device, and the like, to which the flexible substrate is applied.

Referring to FIG. 5, a flexible display device 200 according to an embodiment may include a flexible substrate SUB, a thin film transistor TFT positioned on the flexible substrate SUB, a display device OLED positioned on the thin film transistor TFT and an encapsulation member 300 which isolates the display device OLED from outside environment.

The flexible substrate SUB may include a base substrate 220, an insulating layer 210 positioned on a first surface of the base substrate 220, an adhesive layer 230 positioned on a second surface facing the first surface of the base substrate 220 and a protective film 240 where the adhesive layer 230 is positioned on a lower portion.

The base substrate 220 may be any one of a film base substrate or a plastic base substrate which includes a high molecular weight organic material having flexible property. For example, but without limitation thereto, the base substrate 220 may include any one of polyethersulfone (PES), polyacrylate, polyetherimide (PEI), polyethyelene naphthalate (PEN), polyethylene terephthalate (PET), polyphenylee sulfide (PPS), polyarylate (PAR), polyimide (PI), polycarbonate (PC), cellulose triacetate (TAC), or cellulose acetate propionate (CAP).

The insulating layer 210 may be positioned on the first surface of the base substrate 220. The insulating layer 210 may protect thin film transistors (TFT) to be formed in a subsequent process from penetration of impurities leaking from the base substrate 220. The insulating layer 210 may flatten the surface of the base substrate 220.

The insulating layer 210 may include organic insulating material. The organic insulating material may undergo 0.3% or less weight loss at 450° C. Organic insulating material weight loss of 0.3% or less may include polyimide (PI), polyphenylene, and the like. As the insulating layer 210 is made of organic insulating material, flexibility of the flexible substrate SUB may be achieved.

The protective film 240 may be attached to the second surface facing the first surface of the base substrate 220 by the adhesive layer 230. The protective film 240 may be made in a film form in which inorganic matter is coated to organic matter. The inorganic matter may include silicon oxide (SiOx), silicon nitride (SiNx), silicon oxynitride (SiON), aluminum oxide (AlO), aluminum oxynitride (AlON) and the like. The inorganic matter may be of a single film or multi films. The organic matter may include acrylic resin, polyimide (PI), polyester, and the like.

In particular, the protective film 240 may have barrier property blocking oxygen and moisture from flowing into the base substrate 220 from outside and may have a thickness of 10 μm~50 μm. The protective film 240 may be made in film form in which inorganic matter is coated to organic matter in single film or multi-film form, and flexibility of the flexible substrate SUB may be further secured.

The adhesive layer 230 may attach the protective film 240 on the second surface of the base substrate 220. The adhesive layer 230 may include resin and a cross-linker causing a hardening reaction by heat or light. The resin may include acrylic resin, epoxy resin, and the like. The cross-linker may include an optical initiator causing a hardening reaction by light and a heat initiator causing a hardening reaction by heat.

The thin film transistor TFT may include a semiconductor layer SM formed on an insulating layer 210 of a flexible substrate SUB, a gate electrode GE formed on the semiconductor layer SM, and a source electrode SE and a drain electrode DE formed on the gate electrode GE.

The semiconductor layer SM may be disposed on the insulating layer 210. The semiconductor layer SM may include any one of an amorphous silicon (a-Si), polycrystalline silicon (p-Si) or an oxide semiconductor. In the semiconductor layer SM, an area which contacts the source electrode SE and the drain electrode DE may be a source area and a drain area into which impurities are doped or injected. An area between the source area and the drain area may be a channel area. The oxide semiconductor may include at least one of Zn, In, Ga, Sn or any mixture thereof. For example, but without limitation thereto, the oxide semiconductor may include indium-gallium-zinc-oxide.

Although not illustrated, if the semiconductor layer SM includes an oxide semiconductor, an optical barrier film for blocking light from flowing into an upper portion or a lower portion of the semiconductor layer SM may be disposed. A gate insulating film 250 may be disposed on the semiconductor layer SM.

The gate insulating film 250 may cover the semiconductor layer SM and insulate the semiconductor layer SM and the gate electrode GE.

The gate electrode GE may be disposed by overlapping the semiconductor layer SM. The gate electrode GE may include aluminum (Al), aluminum alloy (Al alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc) or any mixture thereof. An interlayer insulating film 260 may be disposed on the gate electrode GE.

The interlayer insulating film 260 may insulate the gate electrode GE, the source electrode SE and the drain electrode DE. The interlayer insulating film 260 may include organic insulating matter. The organic insulating matter may undergo 0.5% or less of weight loss at 350° C. The organic insulating matter may include polyimide (PI), polyphenylene, and the like. As the interlayer insulating film 260 is formed of organic insulating matter, flexibility of the flexible substrate SUB may be further secured. The source electrode SE and the drain electrode DE may be disposed on the interlayer insulating film 260.

The source electrode SE and the drain electrode DE may be insulated from the gate electrode GE by the interlayer insulating film 260. Also, the source electrode SE and the drain electrode DE may contact the source area and the drain area.

In an embodiment, the thin film transistor TFT is described as being a thin film transistor of a top gate structure as an example, but it not limited thereto. For example, but without limitation thereto, the thin film transistor TFT may be a thin film transistor of a bottom gate structure.

A protective layer 270 may be disposed on the source electrode SE and the drain electrode DE. The protective layer 270 may expose a portion of the drain electrode DE to outside by removing a portion thereof. The protective layer 270 may be an organic protective layer. The organic protective layer may include acrylic, polyimide (PI), polyamide (PA), benzocyclobutene (BCB) or any one thereof. The organic protective layer may be transparent and may have fluidity. As a result, the organic protective layer may be a plantation layer capable of flattening by easing curvature of a lower structure. The display device OLED contacting the drain electrode DE may be disposed on the protective layer 270.

The display device OLED may be an organic light emitting device. Depending on a light emitting form, the display device OLED may be a bottom emission organic light emitting device, a top emission organic light emitting device, or both bottom and top emission organic light emitting device. In an embodiment, the display device OLED is described as a bottom emission organic light emitting device as an example.

The display device OLED may include a first electrode E1 which is a transmissive electrode capable of transmitting light, an organic light emitting layer OL disposed on the first electrode E1, a second electrode E2 disposed on the organic light emitting layer OL and which is a reflector electrode capable of reflecting light.

The first electrode E1 may contact the drain electrode DE. The first electrode E1 may be a conductive layer including a transparent conductive oxide including indium tin oxide (ITO), indium zinc oxide (IZO), aluminum zinc oxide (AZO), gallium doped zinc oxide (GZO), zinc tin oxide (ZTO), gallium tin oxide (GTO), fluorine doped tin oxide (FTO) or any one thereof. The first electrode E1 may be a conductive layer including any one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO) or fluorine doped tin oxide (FTO). A pixel defining layer 280 may be disposed on the first electrode E1.

The pixel defining layer 280 may be opened, and the opened area may expose a portion of the first electrode E1. The pixel defining layer 280 may include an organic insulating material. For example, but without limitation thereto, the pixel defining layer 280 may include at least one of polystyrene, polymethyl methacrylate (PMMA), polyacrylonitrile (PAN), polyamide, polyimide, polyarylether, heterocyclic polymer, parylene, fluorinate polymer, epoxy resin, benzocyclobutene series resin, siloxane series resin or silane resin. The organic light emitting layer OL may be disposed on the first electrode E1 exposed by the pixel defining layer 280.

The organic light emitting layer OL may include at least an emitting layer and may have generally a multi thin film structure. For example, but without limitation thereto, the organic light emitting layer OL may include a hole injection layer for injecting hole, a hole transport layer which has excellent hole transport quality and which increases recombination opportunity of hole and electron by restricting movement of electron which did not get combined in the emitting layer, an emitting layer which emits light from recombination of injected electron and hole, a hole blocking layer for blocking movement of hole which did not get combined in the emitting layer, an electron transport layer for smoothly transporting electron to the emitting layer and an electron injection layer for injecting electrons. A second electrode E2 may be disposed on the organic light emitting layer OL.

The second electrode E2 may include a matter having low work function compared to the first electrode E1, e.g., at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), nickel (Li), calcium (Ca) or an alloy thereof. A conductive layer (not shown) which prevents a voltage drop IR-drop of the second electrode E2 may be further included on the second electrode E2.

The encapsulation member 300 may be a substrate facing the flexible substrate SUB. The encapsulation member 300 may include a same material as the base substrate 220. The encapsulation member 300 may have flexible property. The encapsulation member 300 may isolate the display device OLED from outside environment and may be attached to the flexible substrate SUB through a sealant.

Meanwhile, the encapsulation member 300 may be an encapsulation layer which includes a plurality of inorganic layers (not shown) and a plurality of organic layers (not shown) which cover the display device OLED. The encapsulation layer may prevent moisture and oxygen from penetrating into the display device OLED on the second electrode E2. The organic layer may include epoxy, polyimide, polyethylene terephthalate, polycarbonate, polyethylene, or polyacrylate. The inorganic layer may include at least one of silicon oxide ($SiO_2$), silicon nitride (SiNx), aluminum oxide ($Al_2O_3$), titanium oxide ($TiO_2$), zirconium oxide (ZrOx) or zinc oxide (ZnO).

The flexible display device 200 may further include a filler 400 which fills a space between the flexible substrate SUB and an encapsulation member 300. The filler 400 may prevent damage to the display device OLED from external shock.

The flexible display device 200 as described above may more firmly attach the protective film 240 and the base substrate 220 by forming the adhesive layer 230 with curable resin composition. The problem wherein the protective film 240 and the base substrate 220 are separated from each other due to the stress caused as a result of the folding may be minimized.

As the insulating layer 210, the protective film 240 and the interlayer insulating film 260 are made of organic insulating material, the flexible display device 200 may further secure flexibility.

FIGS. 6 to 13 are cross sectional views illustrating the sequence of steps for manufacturing a flexible display device shown in FIG. 5.

Figure 6:
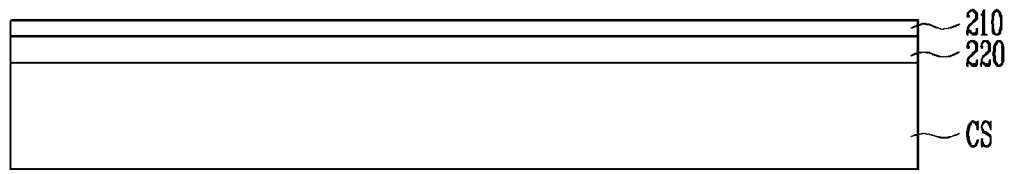
FIGS. 6 to 13 are cross sectional views illustrating in a sequence a manufacturing method of a flexible display device shown in FIG. 5.

Referring to FIG. 6, a base substrate 220 may be formed on a carrier substrate CS. The carrier substrate CS may be a glass substrate. For example, the carrier substrate CS may be a rigid type substrate, capable of preventing the base substrate 220 from being deformed in a subsequent process.

The base substrate 220 may be formed by coating high molecular weight organic material on the carrier substrate CS. The high molecular weight organic material may be any one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP).

After the base substrate 220 is formed, an insulating layer 210 may be formed on the base substrate 220. The insulating layer 210 may include organic insulating material. The organic insulating material may undergo 0.3% or less weight loss at 450° C. The organic insulating material, weight loss of 0.3% or less may include polyimide (PI), polyphenylene, and the like.

Figure 7:
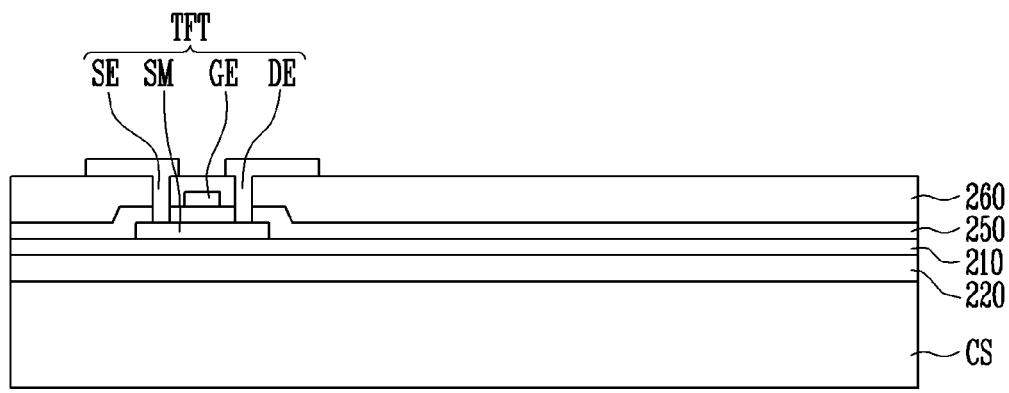

Referring to FIG. 7, after the insulating layer 210 is formed, a thin film transistor TFT may be formed which includes a semiconductor layer SM, a gate electrode GE, source electrode SE and drain electrode DE on the insulating layer 210.

The thin film transistor TFT may be formed as below.

A gate insulating layer 250 which covers the semiconductor layer SM may be formed on the insulating layer 210.

The gate insulating layer 250 may cover the semiconductor layer SM and insulate the semiconductor layer SM and the gate electrode GE.

After the gate insulating layer 250 is formed, a gate electrode GE may be formed by forming a conductive metal layer on the gate insulating layer 250 and patterning it. The gate electrode GE may be disposed by overlapping the semiconductor layer SM. The gate electrode GE may include at least one of aluminum (Al), aluminum alloy (Al alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc) or an alloy thereof.

After the gate electrode GE is formed, an interlayer insulating film 260 may be formed. The interlayer insulating film 260 may include organic insulating material. The organic insulating material may undergo 0.5% or less weight loss at 350° C. The organic insulating material, weight loss of 0.5% or less may include polyimide (PI), polyphenylene, and the like. As the interlayer insulating film 260 is formed, it may be patterned to expose a portion of the semiconductor layer SM. An area exposed in the semiconductor layer SM may be an area which the source electrode SE and the drain electrode DE to be formed thereafter contact.

Successively, the source electrode SE and the drain electrode DE may be formed by forming a conductive layer on the interlayer insulating film 260 and patterning it.

Figure 8:
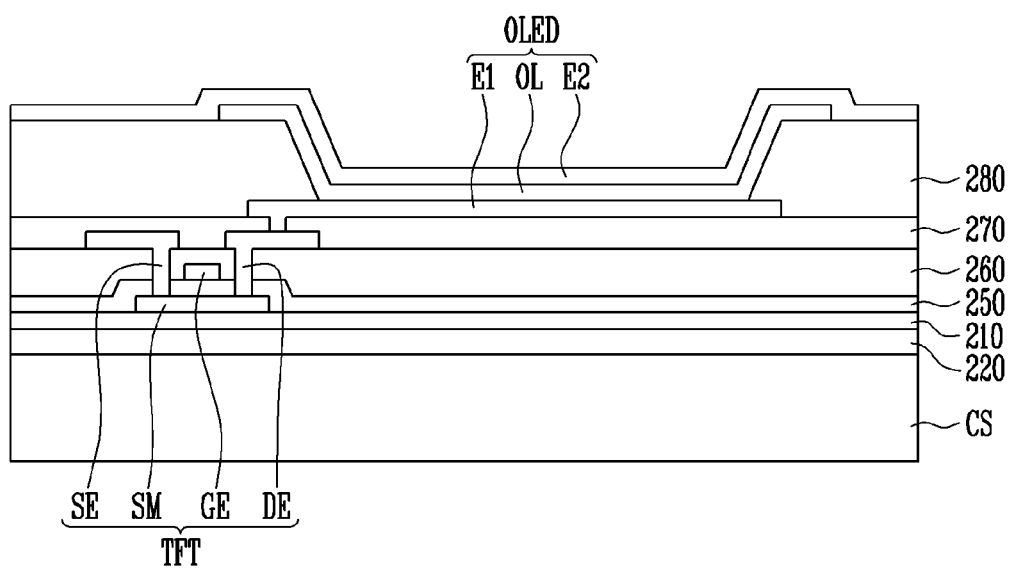

Referring to FIG. 8, after the thin film transistor TFT is formed, the protective layer 270 which covers the thin film transistor TFT may be formed. The protective layer 270 may include at least one layer. For example, but without limitation thereto, the protective layer 270 may be transparent and have flexibility, and thus be an organic protective layer capable of flattening surface by easing curvature of a lower structure. After the protective layer 270 is formed, it may be patterned to expose a portion of the drain electrode DE.

Thereafter, the display device OLED may be formed which contacts the drain electrode DE. The display device OLED may include a first electrode E1 which is a transmissive electrode capable of allowing light to penetrate, an organic light emitting layer OL disposed on the first electrode E1 and a second electrode E2 disposed on the organic light emitting layer OL and which is a reflector electrode reflecting light.

The display device OLED may be formed as below.

The first electrode E1 may be formed by forming a transparent conductive oxide layer on the protective layer 270 and patterning the transparent conductive oxide layer. The first electrode E1 may contact the drain electrode DE. After the first electrode E1 is formed, a pixel defining layer 280 may be formed which exposes a portion of the first electrode E1 on the first electrode E1. The pixel defining layer 280 may be formed by forming an organic insulating material layer OL to cover the first electrode E1 and patterning the organic insulating material layer. After the pixel defining layer 280 is formed, an organic light emitting layer OL may be formed on the first electrode E1 exposed by the pixel defining layer 280. The organic light emitting layer OL may include an emitting layer and generally have a multilayer thin film structure. After the organic light emitting layer OL is formed, the second electrode E2 may be formed on the organic light emitting layer OL.

Figure 9:
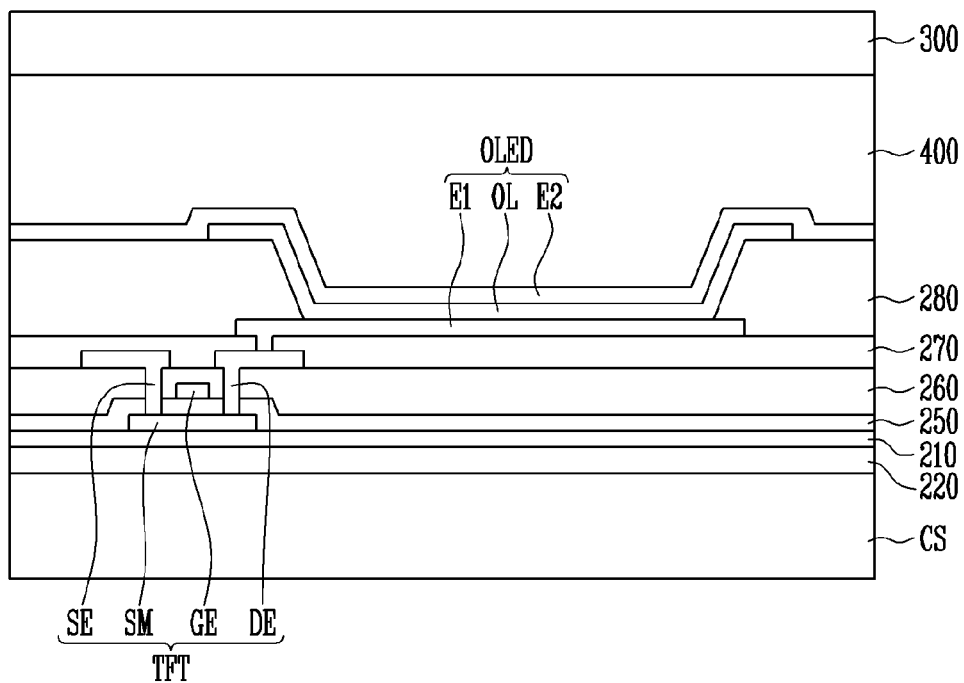

Referring to FIG. 9, after the display device OLED is formed, an encapsulation member 300 may be formed which isolates the display device OLED from outside environment. Thereafter, a filler 400 may be filled between the encapsulation member 300 and the flexible substrate SUB.

Figure 10:
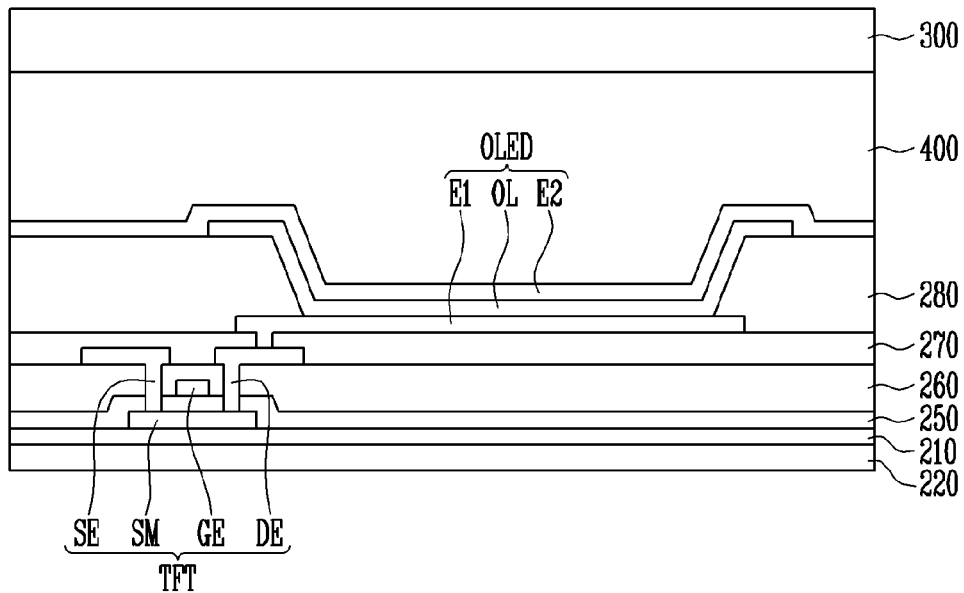

Thereafter, as shown in FIG. 10, the carrier substrate CS may be removed. For example, but without limitation thereto, the carrier substrate CS may be easily removed by applying heat on a surface opposite to a surface on which the base substrate 220 is attached or irradiating a laser beam.

Figure 11:
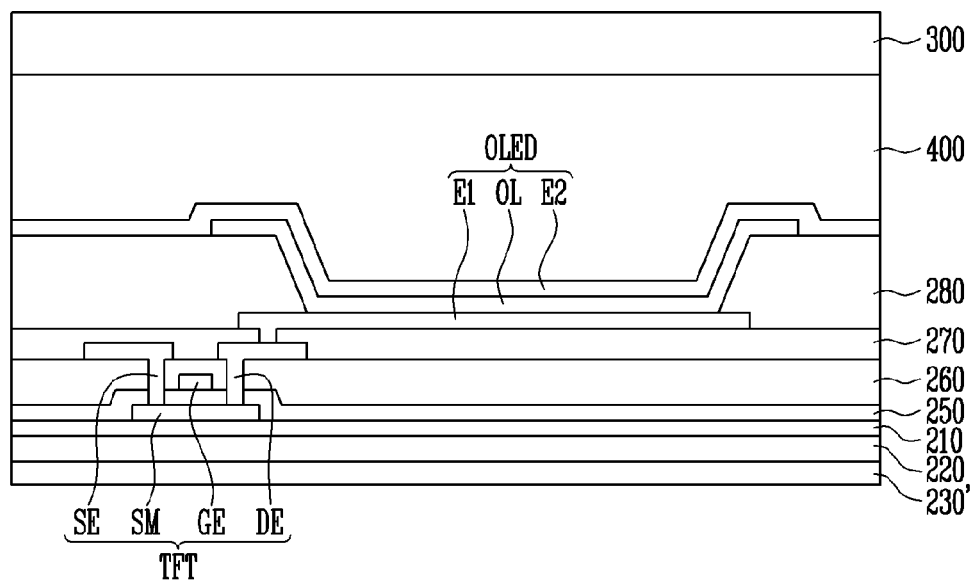

Referring to FIG. 11, the coating liquid 230' may be sprayed using a slit coating method on the second surface of the base substrate 220 exposed to outside by removing the carrier substrate CS. The coating liquid 230' may be formed of a curable resin composition including a cross-linker.

Figure 12:
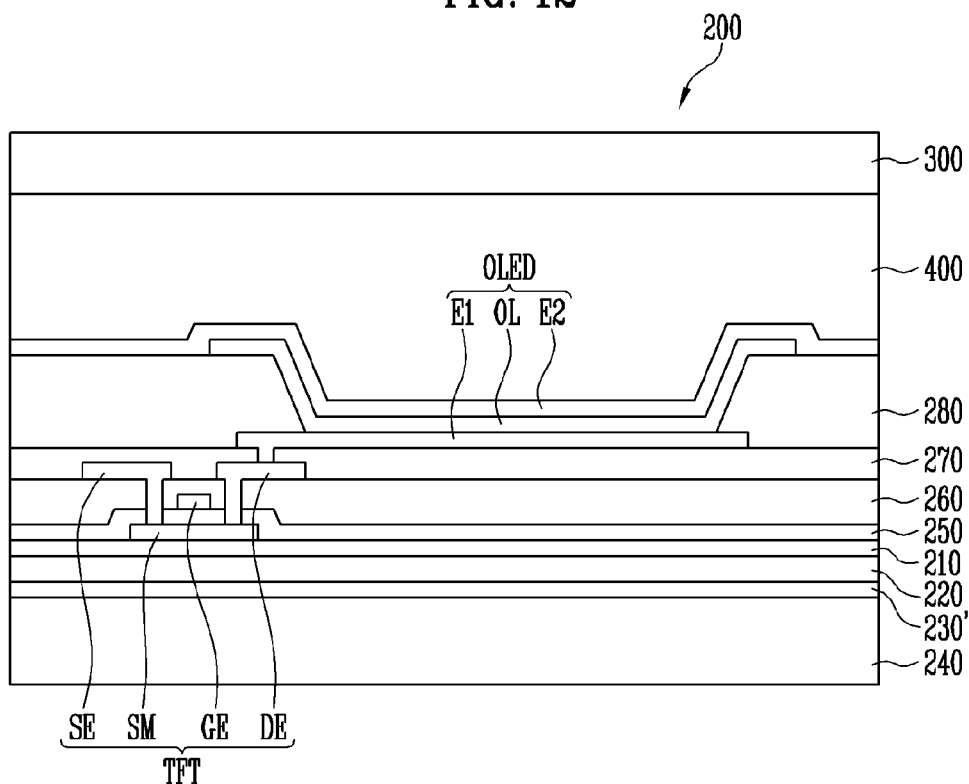

Referring to FIG. 12, the protective film 240 may be formed on the coating liquid 230' coated on the second surface of the base substrate 220. The protective film 240 may be fixed on the coating liquid 230' through the lamination process.

Figure 13:
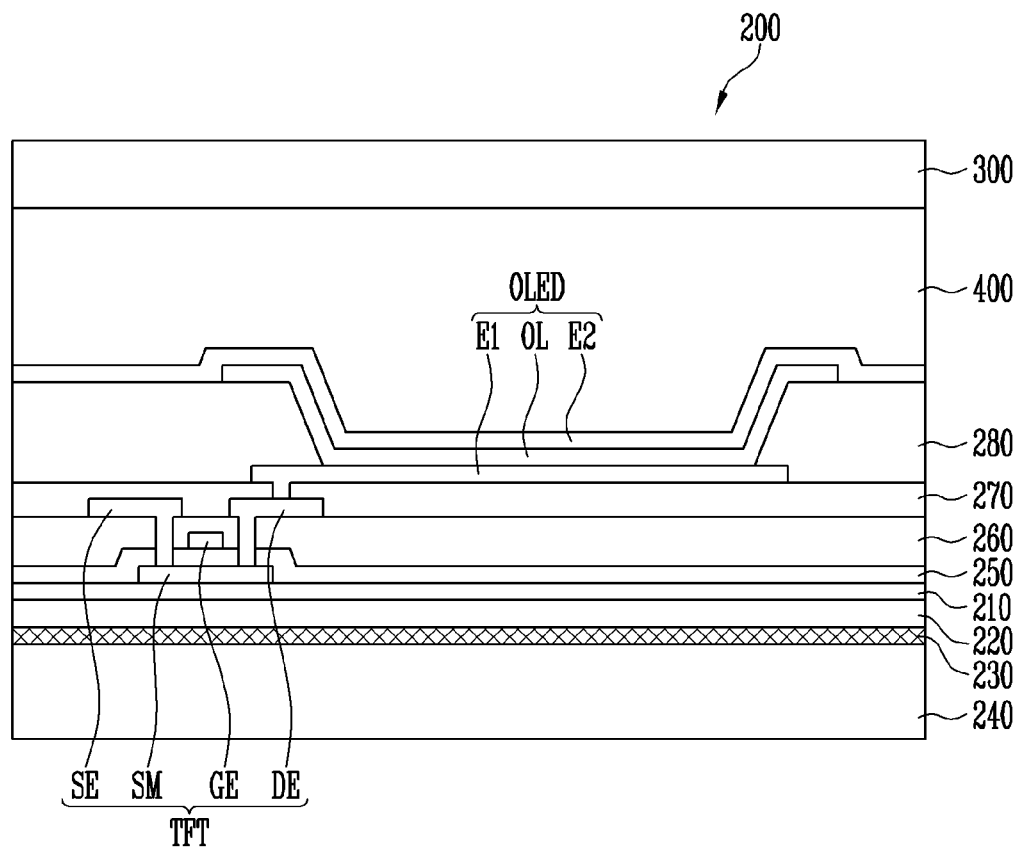

Successively, the adhesive layer 230 as shown in FIG. 13 may be formed by hardening the coating liquid (230' in FIG. 12) through UV irradiation, laser beam irradiation, heat processing, and the like. The adhesive layer 230 may be disposed between the second surface of the base substrate 220 and the protective film 240 in a hardened state and closely attach the base substrate 220 and the protective film 240.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A flexible substrate comprising:
   a base substrate;
   an insulating layer positioned on a first surface of the base substrate;
   a protective film positioned on a second surface facing the first surface of the base substrate; and
   an adhesive layer positioned between the base substrate and the protective film and attaching the protective film on the second surface of the base substrate,
   wherein the adhesive layer includes a cross-linker,
   wherein the insulating layer includes polyimide (PI) or polyphenylene, and
   wherein weight loss of the polyimide (PI) or the polyphenylene is 0.3% or less at 450° C.

2. The flexible substrate as claimed in claim 1, wherein the adhesive layer includes at least any one of acrylic resin or epoxy resin.

3. The flexible substrate as claimed in claim 1, wherein the cross-linker includes at least any one of an optical initiator or a heat initiator.

4. The flexible substrate as claimed in claim 1, wherein the base substrate includes one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP).

5. A method for manufacturing a flexible substrate comprising:

forming an insulating layer on a first surface of a base substrate;

forming an adhesive layer on a second surface facing the first surface of the base substrate;

providing a protective film on the adhesive layer;

attaching the protective film and the base substrate by pressurizing the protective film; and hardening the adhesive layer, wherein the adhesive layer includes a cross-linker, wherein the insulating layer includes polyimide (PI) or polyphenylene, and wherein weight loss of the polyimide (PI) or the polyphenylene is 0.3% or less at 450° C.

6. The method as claimed in claim 5, wherein the hardening of the adhesive layer may include any one selected from a method of irradiating ultraviolet (UV) light, a method of irradiating laser, or a method of heat processing.

7. The method as claimed in claim 5, wherein the coating of the adhesive layer on the second surface facing the first surface of the base substrate is achieved by a slit coating method.

8. A flexible display device comprising:

a flexible substrate; and an emission device disposed on the flexible substrate, wherein the flexible substrate comprises:

a base substrate;

an insulating layer positioned on a first surface of the base substrate;

a thin film transistor formed on the insulating layer;

a protective film positioned on a second surface facing the first surface of the base substrate; and an adhesive layer positioned between the base substrate and the protective film and attaching the protective film on the second surface of the base substrate, wherein the adhesive layer includes a cross-linker, wherein the insulating layer includes polyimide (PI) or polyphenylene, and wherein weight loss of the polyimide (PI) or the polyphenylene is 0.3% or less at 450° C.

9. The flexible display device as claimed in claim 8, wherein the adhesive layer includes at least one of acrylic resin or epoxy resin.

10. The flexible display device as claimed in claim 8, wherein the cross-linker includes at least one of an optical initiator or a heat initiator.

11. The flexible display device as claimed in claim 8, wherein the base substrate includes one of polyethersulfone (PES), polyacrylate, polyetherimide (PEI), polyethyelene naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP).

12. The flexible display device as claimed in claim 8, wherein the thin film transistor comprises:

a semiconductor layer;

a gate insulating film disposed on the semiconductor layer;

a gate electrode disposed on the gate insulating film;

an interlayer insulating film disposed on the gate electrode; and a source electrode and a drain electrode disposed on the interlayer insulating film, wherein the interlayer insulating film is formed of an organic insulating material.

13. The flexible display device as claimed in claim 12, wherein the interlayer insulating film includes polyimide (PI) or polyphenylene.

14. The flexible display device as claimed in claim 8, further comprising an encapsulation layer which covers the emission device wherein the encapsulation layer includes plurality of inorganic layers and plurality of organic layers.

15. The flexible display device as claimed in claim 14, further comprising a filler layer between the encapsulation layer and the flexible substrate.

16. The flexible display device as claimed in claim 14, where the polyimide (PI) or the polyphenylene has 0.5% or less weight loss at 350° C.

* * * * *